(12) United States Patent  (10) Patent No.: US 9,989,820 B2
Park  (45) Date of Patent: Jun. 5, 2018

(54) DISPLAY DEVICE INCLUDING FLEXIBLE PRINTED CIRCUIT BOARD

(71) Applicant: Samsung Display Co., Ltd., Yongin, Gyeonggi-Do (KR)

(72) Inventor: Jung Mok Park, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 726 days.

(21) Appl. No.: 14/281,613

(22) Filed: May 19, 2014

(65) Prior Publication Data

US 2015/0163939 A1  Jun. 11, 2015

(30) Foreign Application Priority Data

Dec. 9, 2013  (KR) .................. 10-2013-0152664

(51) Int. Cl.
  *H05K 1/18* (2006.01)
  *G02F 1/1345* (2006.01)
  *H01L 27/32* (2006.01)

(52) U.S. Cl.
  CPC ...... *G02F 1/13452* (2013.01); *H01L 27/3276* (2013.01); *H05K 1/18* (2013.01)

(58) Field of Classification Search
  None
  See application file for complete search history.

(56) References Cited

U.S. PATENT DOCUMENTS

| 7,432,451 | B2 * | 10/2008 | Yamada | G02F 1/13452 |
| | | | | 174/254 |
| 7,432,998 | B2 * | 10/2008 | Nishio | G02F 1/13452 |
| | | | | 349/150 |
| 7,544,897 | B2 * | 6/2009 | Kobayashi | G02F 1/13452 |
| | | | | 174/254 |
| 7,812,913 | B2 | 10/2010 | Oohira | |
| 8,382,361 | B2 * | 2/2013 | Park | G02B 6/009 |
| | | | | 174/254 |
| 8,492,969 | B2 * | 7/2013 | Lee | H05B 33/04 |
| | | | | 313/504 |
| 8,823,042 | B2 * | 9/2014 | Kim | H01L 27/3225 |
| | | | | 257/99 |
| 2002/0008681 | A1 * | 1/2002 | Hanakawa | G02F 1/1345 |
| | | | | 345/87 |

(Continued)

FOREIGN PATENT DOCUMENTS

JP  2001-305568 A  10/2001
JP  3764945 B2  2/2006

(Continued)

*Primary Examiner* — Courtney Smith
*Assistant Examiner* — Jessey R Ervin
(74) *Attorney, Agent, or Firm* — Knobbe, Martens, Olson & Bear, LLP

(57) ABSTRACT

A display device is disclosed. In one aspect, the display device includes a panel including a plurality of wiring patterns and a flexible printed circuit board formed over and at least partially overlapping an edge of the panel. The flexible printed circuit board includes a connection portion electrically connected to the panel and the connection portion includes first and second surfaces opposing each other. The wiring patterns include a plurality of first wiring patterns connected to the first surface of the connection portion and a plurality of second wiring patterns connected to the second surface of the connection portion.

17 Claims, 10 Drawing Sheets

(56) References Cited

U.S. PATENT DOCUMENTS

2006/0220991 A1* 10/2006 Lee .................... G02F 1/13452
345/52

FOREIGN PATENT DOCUMENTS

| JP | 3792554 B2 | 4/2006 |
| KR | 10-0480154 B1 | 3/2005 |
| KR | 10-2012-0045291 A | 5/2012 |
| KR | 10-2013-0053939 A | 5/2013 |

* cited by examiner

DISPLAY DEVICE INCLUDING FLEXIBLE PRINTED CIRCUIT BOARD

INCORPORATION BY REFERENCE TO ANY PRIORITY APPLICATIONS

This application claims priority to and the benefit of Korean Patent Application No. 10-2013-0152664 filed in the Korean Intellectual Property Office on Dec. 9, 2013, the entire contents of which are incorporated herein by reference.

BACKGROUND

Field

The described technology generally relates to a display device.

Description of the Related Technology

Examples of flat panel displays include liquid crystal displays (LCDs), organic light-emitting diode (OLED) displays, plasma display panels (PDPs), and electrophoretic displays (EPDs).

Flat panel displays can include a display panel for displaying images, a touch panel formed on a front side of the display panel, a signal driver for applying driving signals or touch signals to the display panel or the touch panel, and a flexible printed circuit board (FPCB) for electrically connecting the display panel to the signal driver or the touch panel to the signal driver. The flexible printed circuit board can be bent with a 180 degree angle, so that the driver can be formed on a rear side or a front side of the display panel or the touch panel.

SUMMARY OF CERTAIN INVENTIVE ASPECTS

One inventive aspect is a display device including an FPCB compressed unit.

Another aspect is a display device including a panel including a plurality of wiring patterns, and a flexible printed circuit board formed on an edge of the panel and including a compressed unit attached to the panel, wherein the wiring patterns include a first wiring pattern coming from the compressed unit in a first direction and a second wiring pattern coming from the compressed unit in a second direction, and the first direction is different from the second direction.

The first direction goes to a center unit of the panel and the second direction goes to an edge of the panel.

The panel is a touch panel and the touch panel includes an encapsulation substrate, a wiring pattern formed on the encapsulation substrate and formed along a peripheral area of the encapsulation substrate, and a window substrate covering the encapsulation substrate, wherein the window substrate is connected to the flexible printed circuit board by a double-sided adhesive tape.

The display device further includes an adhesive layer formed between at least a part from among portions excluding the compressed unit from the encapsulation substrate and the window substrate.

The encapsulation substrate is formed of a flexible material.

The panel is a touch panel and the touch panel includes an encapsulation substrate, a wiring pattern formed on the encapsulation substrate and formed along a peripheral area of the encapsulation substrate, and a window substrate covering the encapsulation substrate, wherein an incised unit is formed on an edge of the encapsulation substrate neighboring outside the compressed unit.

The display device further includes an adhesive layer formed between at least a part from among portions excluding the compressed unit from the encapsulation substrate and the window substrate.

The adhesive layer includes a part that surrounds three sides of the compressed unit with respect to a plane.

The compressed unit is separated from an edge of the encapsulation substrate by a width of the incised unit.

The flexible printed circuit board overlaps a region in which the incised unit is formed.

Another aspect is a display device including a panel including a plurality of wiring patterns and a flexible printed circuit board formed over and at least partially overlapping an edge of the panel, wherein the flexible printed circuit board includes a connection portion electrically connected to the panel and wherein the connection portion includes first and second surfaces opposing each other, wherein the wiring patterns include a plurality of first wiring patterns connected to the first surface of the connection portion and a plurality of second wiring patterns connected to the second surface of the connection portion.

The first surface of the connection portion faces the center of the panel and the second surface of the connection portion faces the edge of the panel. The panel includes a touch panel and an encapsulation substrate encapsulating the touch panel, wherein the wiring patterns are formed over the encapsulation substrate and in a peripheral area of the encapsulation substrate, wherein the display device further includes a window substrate covering the encapsulation substrate, and wherein the window substrate is connected to the flexible printed circuit board via a double-sided adhesive tape. The display device further includes an adhesive layer interposed between the encapsulation substrate and the window substrate, wherein the adhesive layer overlaps substantially the entire encapsulation substrate and does not overlap the connection unit. The encapsulation substrate is formed at least in part of a flexible material. The double-sided adhesive tape is interposed between the connection portion and an edge of the encapsulation substrate adjacent to the connection portion. The panel includes upper and lower sides opposing each other and wherein the flexible printed circuit board is configured to be bent such that at least a portion of the flexible printed circuit board is below the lower side of the panel. The panel includes a touch panel and an encapsulation substrate encapsulating the touch pane, wherein the wiring patterns are formed over the encapsulation substrate and in a peripheral area of the encapsulation substrate, wherein the display device further includes a window substrate covering the encapsulation substrate, and wherein a recess is defined in an edge of the encapsulation substrate neighboring the connection portion.

The display device further includes an adhesive layer interposed between the encapsulation substrate and the window substrate, wherein the adhesive layer overlaps substantially the entire encapsulation substrate and does not overlap the connection portion. The adhesive layer surrounds three sides of the connection portion. The connection portion is spaced apart from the edge of the encapsulation substrate by the width of the recess. The flexible printed circuit board substantially overlaps the recess. The panel includes upper and lower sides opposing each other and wherein at least a portion the flexible printed circuit board is configured to be bent toward the lower side of the panel. The encapsulation substrate is formed at least partially of a flexible material.

Another aspect is a display device including a substrate, a plurality of pixels formed over the substrate, an encapsulation layer formed over the pixels, a plurality of first and second wiring patterns formed over the encapsulation layer, and a flexible circuit board formed over and partially overlapping the encapsulation layer, wherein the flexible circuit board includes a connection portion electrically connected to the wiring patterns and wherein the connection portion includes first and second surfaces opposing each other, wherein the first wiring patterns are connected to the first surface of the connection portion and wherein the second wiring patterns are connected to the second surface of the connection portion.

The display device further includes a contact sensing layer formed over the encapsulation substrate in a touch active area and a peripheral area surrounding the touch active area, wherein the wiring patterns are formed in the peripheral area and are electrically connect to the contact sensing layer. The display device further includes a window substrate formed over the encapsulating substrate and connected to the flexible printed circuit board via a double-sided adhesive tape, wherein the double-sided adhesive tape is interposed between the connection portion and an edge of the encapsulation substrate adjacent to the connection portion. The display device further includes an adhesive layer interposed between the encapsulation substrate and the window substrate, wherein the adhesive overlaps substantially the entire encapsulation substrate and does not overlap the connection portion or the double-sided adhesive tape. A recess is defined in an edge of the encapsulation substrate neighboring the connection portion and the flexible printed circuit board substantially overlaps the recess. The flexible printed circuit board includes first and second portions, wherein the first portion is closer to the center of the panel than the second portion, and wherein the width of the first portion is greater than the width of the second portion.

According to at least one embodiment, when the compressed unit at which the flexible printed circuit board and the edge of the panel are bonded is located away from the edge of the panel toward the internal side of the panel and the FPCB is bent, the panel of the substrate does not separate and no cracks are generated. Further, the wiring pattern is formed between the compressed unit and the edge of the panel, thereby reducing the dead area caused by moving the compressed unit toward the inside of the panel.

DETAILED DESCRIPTION OF CERTAIN INVENTIVE EMBODIMENTS

Figure 1:
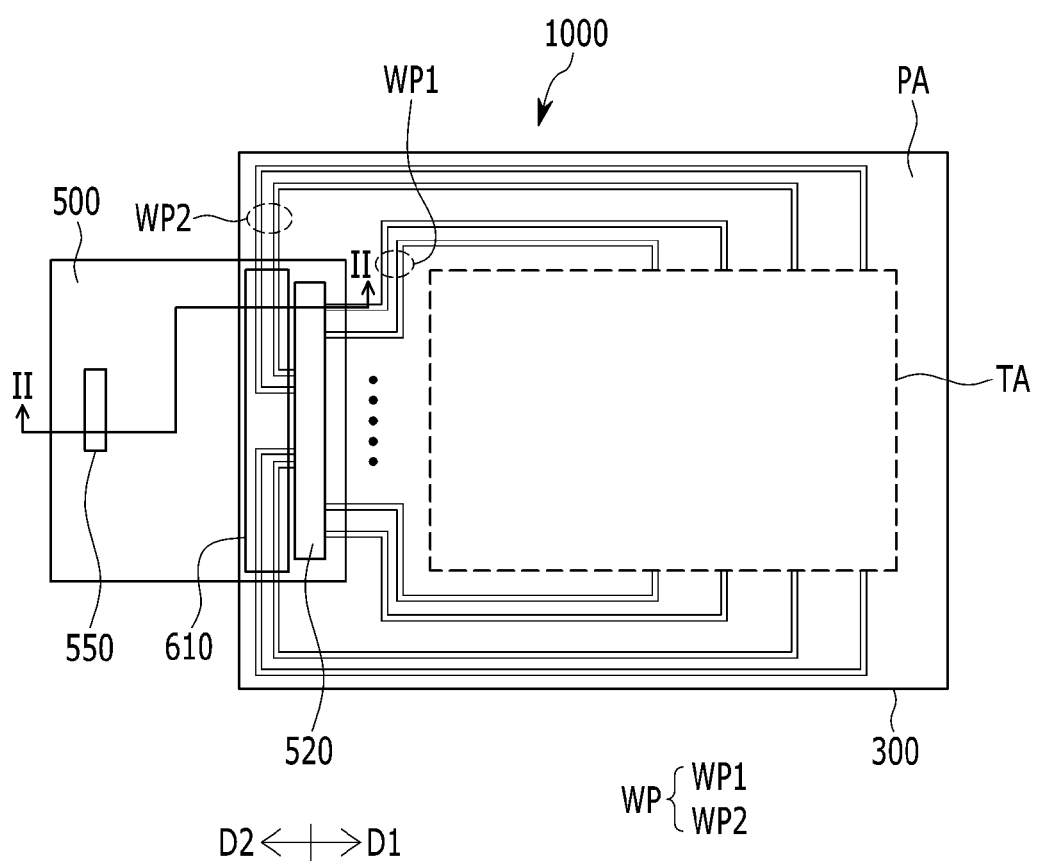
FIG. 1 shows a layout view of a touch panel according to an exemplary embodiment.

Recently, display panels have been developed with a flexible substrate or touch panel. The FPCB includes a connection portion connected to the substrate. When the FPCB is bent it exerts a force on the flexible substrate through the connection portion, which can result in separation between the FPCB and the substrate or can generate cracks in the substrate.

Hereinafter, exemplary embodiments of the described technology will be described in detail with reference to the accompanying drawings. As those skilled in the art would realize, the described embodiments may be modified in various different ways, all without departing from the spirit or scope of the described technology. On the contrary, the exemplary embodiments introduced herein are described only to make disclosed contents thorough and complete and sufficiently transfer the spirit of the described technology to those skilled in the art.

In the drawings, the thicknesses of layers, films, panels, regions, etc., may be exaggerated for clarity. It will be understood that when a layer is referred to as being "on" another layer or substrate, it can be directly on the other layer or substrate, or intervening layers may also be present. Like reference numerals designate like elements throughout the specification.

Figure 2:
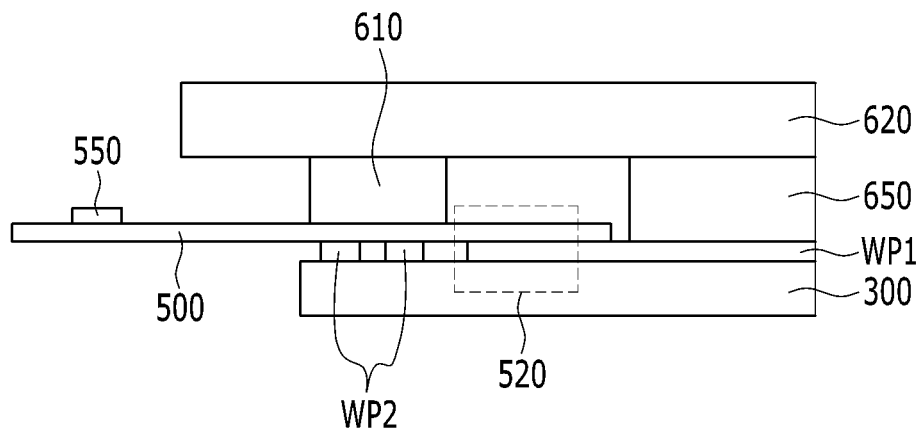
FIG. 2 shows a cross-sectional view with respect to line II-II of FIG. 1.
Figure 3:
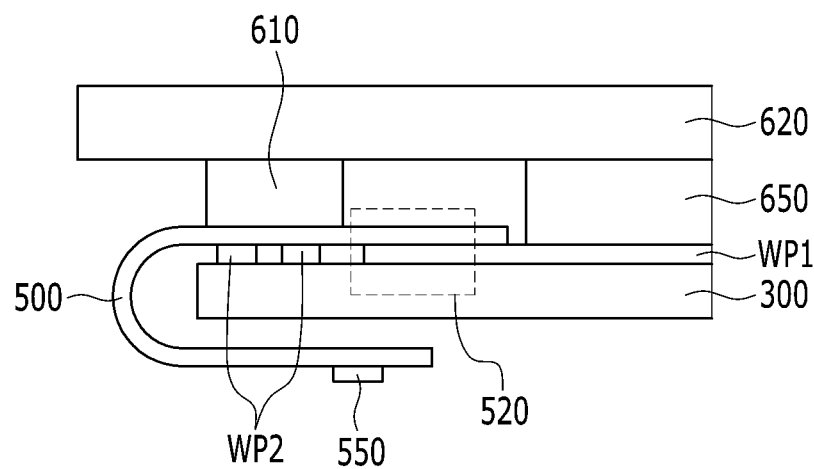
FIG. 3 shows a cross-sectional view of the flexible printed circuit board of FIG. 2 in a bent state.

FIG. 1 shows a layout view of a touch panel according to an exemplary embodiment. FIG. 2 shows a cross-sectional view with respect to line II-II of FIG. 1. FIG. 3 shows a cross-sectional view of the flexible printed circuit board of FIG. 2 in a bent state.

Referring to FIG. 1 and FIG. 2, the touch panel 1000 includes an encapsulation substrate 300, a flexible printed circuit board 500 bonded at an edge of the encapsulation substrate 300, and a window substrate 620 covering the encapsulation substrate 300. The encapsulation substrate 300 may be formed of a flexible material.

A contact sensing layer (not shown) can be formed in a touch active area (TA) on the encapsulation substrate 300. The touch active area (TA) corresponds to the display area of the display device on which the touch panel is installed. A periphery of the touch active area (TA) corresponds to a peripheral area (PA) of the encapsulation substrate 300 and a plurality of wiring patterns (WP) electrically connected to the contact sensing layer (not shown) are formed in the peripheral area (PA).

The flexible printed circuit board 500 is formed at an edge of the encapsulation substrate 300 and the wiring patterns (WP) are electrically connected to the flexible printed circuit board 500 via a compressed unit or connection portion 520 of the flexible printed circuit board 500. Although not shown, the flexible printed circuit board 500 and the wiring patterns (WP) in the compressed unit 520 can be bonded together by a conductive adhesive. A touch driver 550 is formed on the flexible printed circuit board 500.

The compressed unit 520 is spaced apart from an edge of the encapsulation substrate 300. A wiring pattern (WP2) is formed between the edge of the encapsulation substrate 300 and the compressed unit 520. In detail, the wiring patterns (WP) include first wiring patterns (WP1) extending from the compressed unit 520 in a first direction (D1) that extends toward the center of the touch panel 1000. The wiring patterns (WP) also include second wiring patterns (WP2) extending from the compressed unit 520 in a second direction (D2) different from the first direction (D1). The second direction (D2) extends from the compressed unit 520 to the edge of the touch panel 1000.

The first wiring patterns (WP1) extending from the compressed unit 520 are formed in the periphery of the touch active area (TA) and first wiring patterns (WP1) are electrically connected to a contact sensing layer (not shown) of the touch active area (TA).

The second wiring patterns (WP2) extending from the compressed unit 520 are formed near the edges of the touch panel 1000 and second wiring patterns (WP2) are electrically connected to the contact sensing layer (not shown) of the touch active area (TA). The second wiring patterns (WP2) are formed closer to the edges of the touch panel 100 than the first wiring patterns (WP1).

A double-sided adhesive tape 610 is interposed between a portion of the flexible printed circuit board 500 overlapping the second wiring patterns (WP2) and a corresponding portion of the window substrate 620. According to the FIG. 1 embodiment, the double-sided adhesive tape 610 is located between the compressed unit 520 and the edge of the encapsulation substrate 300.

The double-sided adhesive tape 610 is placed near the edge of the encapsulation substrate 300 and is attached to the window substrate 620 and the flexible printed circuit board 500 so that bending stress applied to the encapsulation substrate 300 can be reduced when the flexible printed circuit board 500 is bent.

FIG. 3 shows a state in which the flexible printed circuit board 500 of FIG. 2 is bent to the rear side of the encapsulation substrate 300. The compressed unit 520 electrically connecting the flexible printed circuit board 500 to the encapsulation substrate 300 is formed away from the edge of the encapsulation substrate 300 toward the internal side of the touch panel 1000 and the bending stress is reduced due to the double-sided adhesive tape 610 placed on the edge of the encapsulation substrate 300. Accordingly, the double-sided adhesive tape 610 shields the compressed unit 520 from the bending stress.

Figure 4:
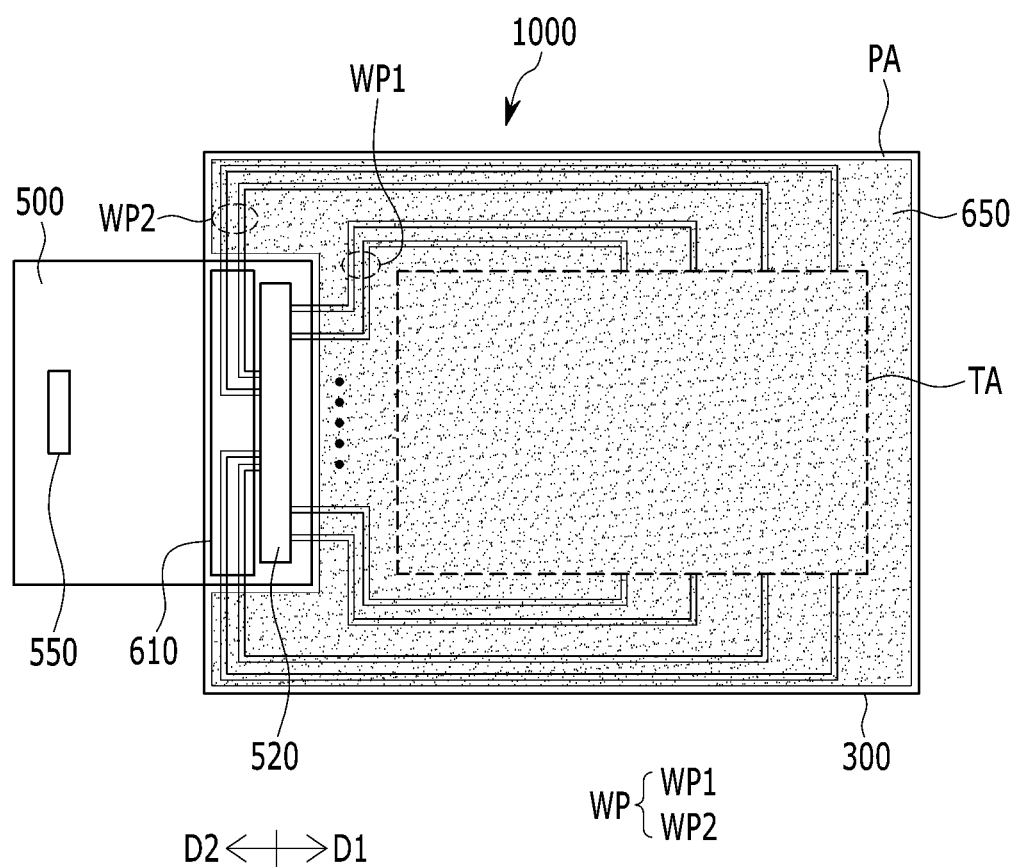
FIG. 4 shows a layout view of a region in which an adhesive layer is formed in the embodiment of FIG. 1.

FIG. 4 shows a layout view of the touch panel of FIG. 1 including a region in which an adhesive layer is formed.

Referring to FIG. 3 and FIG. 4, an adhesive layer 650 is formed over the majority of the touch active area (TA) and the peripheral area (PA) of the encapsulation substrate 300. The adhesive layer 650 is interposed between the encapsulation substrate 300 and the window substrate 620 and is formed of a transparent material. In FIG. 4, the shaded region indicates the region in which the adhesive layer 650 is formed.

The panel has been described as a touch panel, but the described technology is not limited thereto. In some embodiments, the described connection structure of the panel and the flexible printed circuit board is embodied as a liquid crystal panel or an organic electroluminescent display panel.

Figure 5:
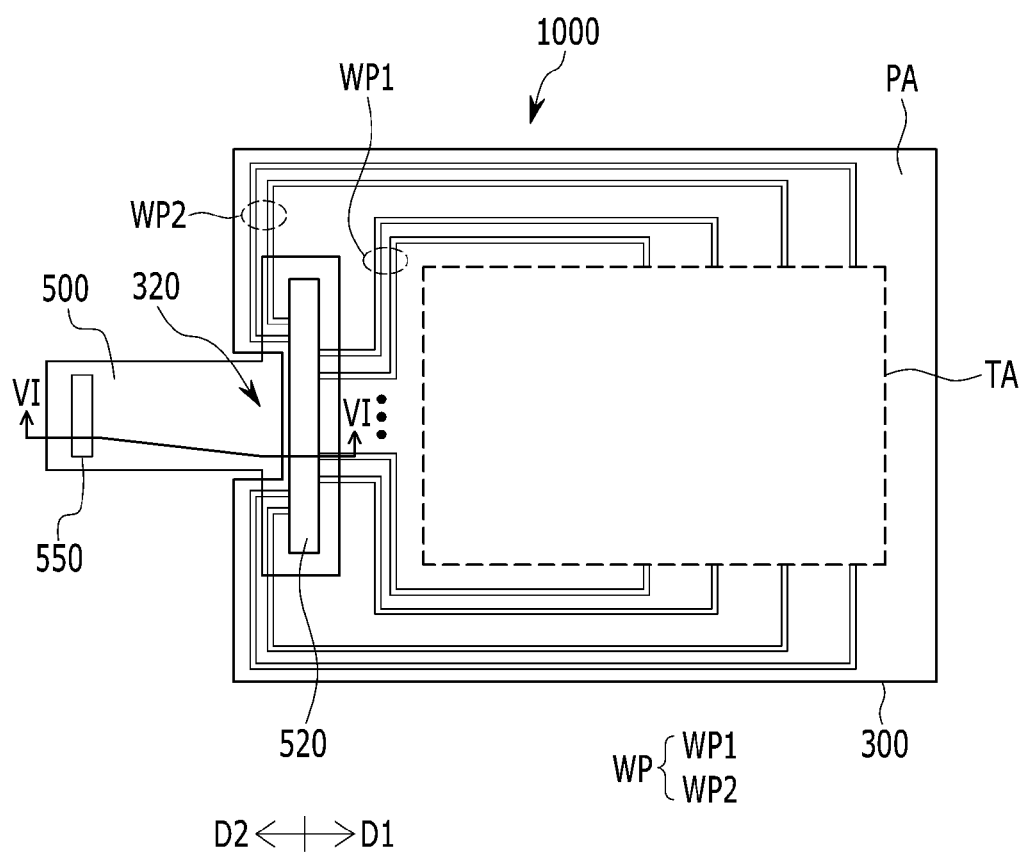
FIG. 5 shows a layout view of a touch panel according to an exemplary embodiment.
Figure 6:
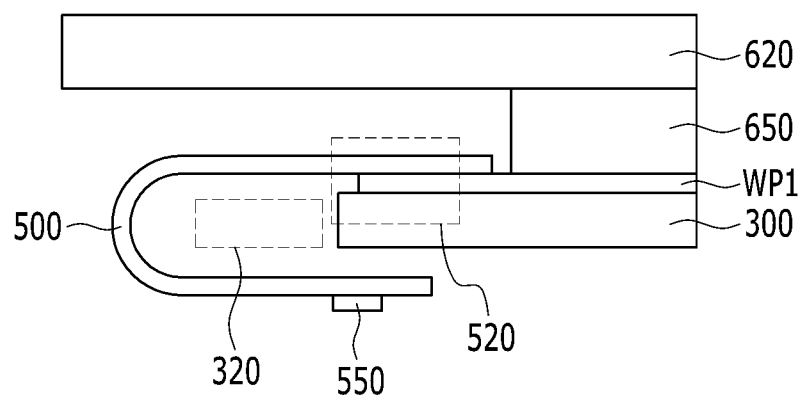
FIG. 6 shows a cross-sectional view with respect to line VI-VI of FIG. 5.

FIG. 5 shows a layout view of a touch panel according to an exemplary embodiment. FIG. 6 shows a cross-sectional view with respect to line VI-VI of FIG. 5.

The exemplary embodiment of FIG. 5 and FIG. 6 substantially corresponds to the exemplary embodiment described with reference to FIG. 1 to FIG. 4. The differences between the present embodiment and the embodiment of FIG. 1 to FIG. 4 will now be described.

Referring to FIG. 5 and FIG. 6, the double-sided adhesive tape described in the exemplary embodiment of FIG. 1 to FIG. 4 is not included and an incised unit or recess 320 is defined in a part of the encapsulation substrate 300 corresponding to the region in which the double-sided adhesive tape is formed.

The incised unit 320 is formed on the edge of the encapsulation substrate 300 neighboring the compressed unit 520. In detail, the compressed unit 520 is separated from the edge of the encapsulation substrate 300 by the width of the incised unit 320.

The flexible printed circuit board 500 overlaps the region in which the incised unit 320 is formed. Since the compressed unit 520 is located at a distance from the bending area in which the flexible printed circuit board 500 is bent, it is possible to reduce the transfer of the bending force from the bending area of the flexible printed circuit board 500 to the encapsulation substrate 300.

Aside from the above-described difference, the description of the embodiment of FIG. 1 to FIG. 4 is applicable to the embodiment of FIGS. 5 and 6.

Figure 7:
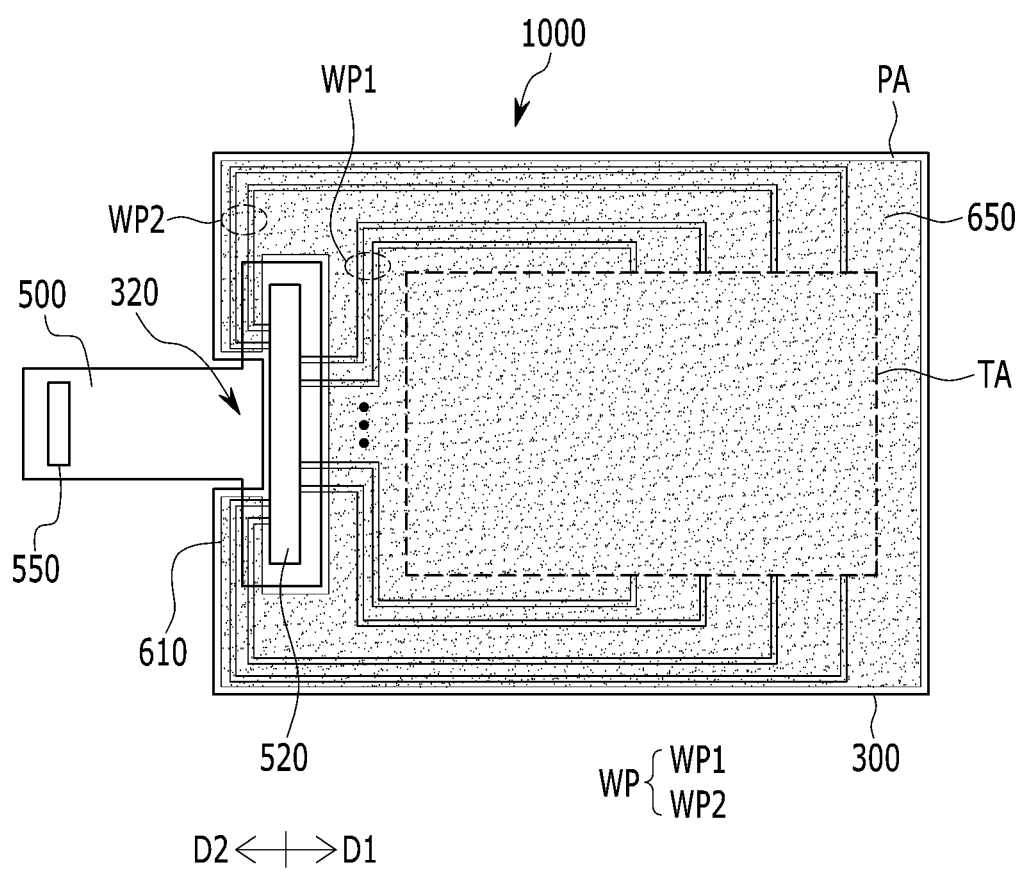
FIG. 7 shows a layout view of a region in which an adhesive layer is formed in the embodiment of FIG. 5.

FIG. 7 shows a layout view of the touch panel of FIG. 5 including a region in which an adhesive layer is formed.

Referring to FIG. 6 and FIG. 7, the adhesive layer 650 formed over the majority of the touch active area (TA) and the peripheral area (PA) of the encapsulation substrate 300, and particularly, in the FIG. 7 embodiment, the adhesive layer 650 includes a portion that surrounds three sides of the compressed unit 520. In FIG. 7, the shaded region indicates the region in which the adhesive layer 650 is formed.

Figure 8:
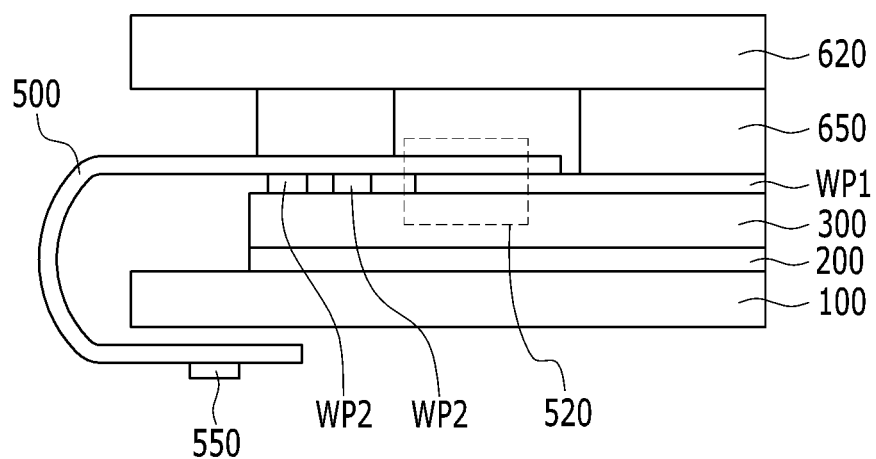
FIG. 8 shows a cross-sectional view of a display device according to an exemplary embodiment.

FIG. 8 shows a cross-sectional view of a display device according to an exemplary embodiment.

Referring to FIG. 8, the above-described touch panel 1000 is shown as attached to a display device.

The display device includes a substrate 100. A thin film display layer 200, an encapsulation substrate 300, and a window substrate 620 are sequentially formed on the substrate 100. Further, the display device includes a flexible printed circuit board 500 connected to the encapsulation substrate 300. Here, the encapsulation substrate 300 may be the encapsulation substrate 300 of any one of the previously described embodiments. The flexible printed circuit board 500 may be bent to a lower portion of the substrate 100.

The described display device may be an organic light-emitting diode (OLED) display which will now be described.

Figure 9:
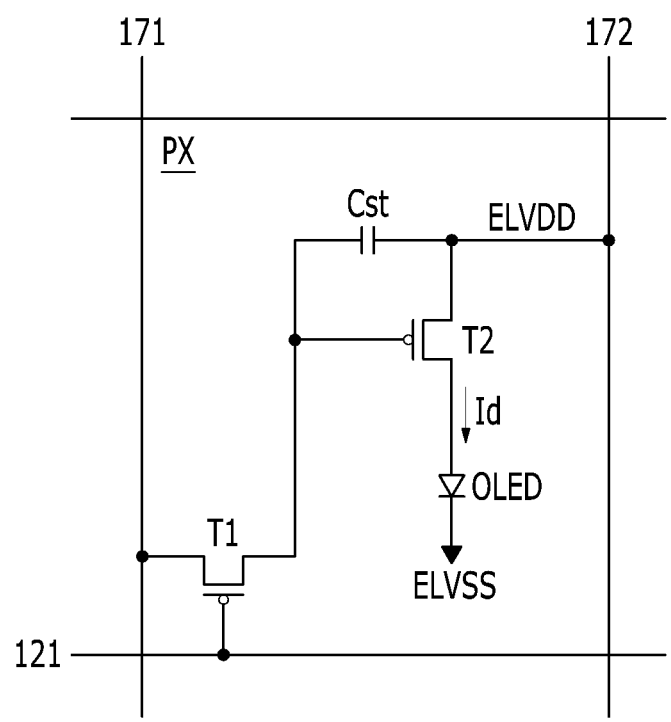
FIG. 9 shows an equivalent circuit diagram of a pixel of an OLED display according to an exemplary embodiment.

FIG. 9 shows an equivalent circuit diagram of a pixel of an OLED display according to an exemplary embodiment.

Referring to FIG. 9, the OLED display includes a plurality of signal lines 121, 171, and 172 and a plurality of pixels (PX) that are electrically connected thereto and are substantially arranged in a matrix.

The signal lines include a plurality of gate lines 121 for transmitting gate signals (or scan signals), a plurality of data lines 171 for transmitting data signals, and a plurality of driving voltage lines 172 for transmitting a driving voltage (ELVDD). The gate signals and the data signals are respectively generated by a gate driver and a data driver (not shown).

The gate lines 121 substantially extend in a row direction and the data lines 171 and the driving voltage lines 172 substantially extend in a column direction.

Each of the pixels (PX) includes a switching thin film transistor (T1), a driving thin film transistor (T2), a storage capacitor (Cst), and an OLED.

The switching thin film transistor (T1) includes a control terminal, an input terminal, and an output terminal. The control terminal is connected to the gate line 121, the input terminal is connected to the data line 171, and the output terminal is connected to the driving thin film transistor (T2). The switching thin film transistor (T1) transmits a data signal received from the data line 171 to the driving thin film transistor (T2) in response to the gate signal applied to the gate line 121.

The driving thin film transistor (T2) includes a control terminal, an input terminal, and an output terminal. The control terminal is connected to the switching thin film transistor (T1), the input terminal is connected to the driving voltage line 172, and the output terminal is connected to the OLED. The driving thin film transistor (T2) outputs an output current (Id) that varies based on the voltage between the control terminal and the output terminal.

The storage capacitor (Cst) is connected between the control terminal and the input terminal of the driving thin film transistor (T2). The storage capacitor (Cst) stores the data signal applied to the control terminal of the driving thin film transistor (T2) and maintains the same when the switching thin film transistor (T1) is turned off.

The OLED includes an anode connected the output terminal of the driving thin film transistor (T2) and a cathode connected to the common voltage (ELVSS). The OLED emits light with an intensity based on the output current (Id) of the driving thin film transistor (T2) and displays an image.

The switching thin film transistor (T1) and the driving thin film transistor (T2) may be n-channel field effect transistors (FETs) or p-channel field effect transistors. Further, connections between the switching and driving thin film transistors (T1) and (T2), the storage capacitor (Cst), and the OLED can be variously modified based on the design requirements.

Figure 10:
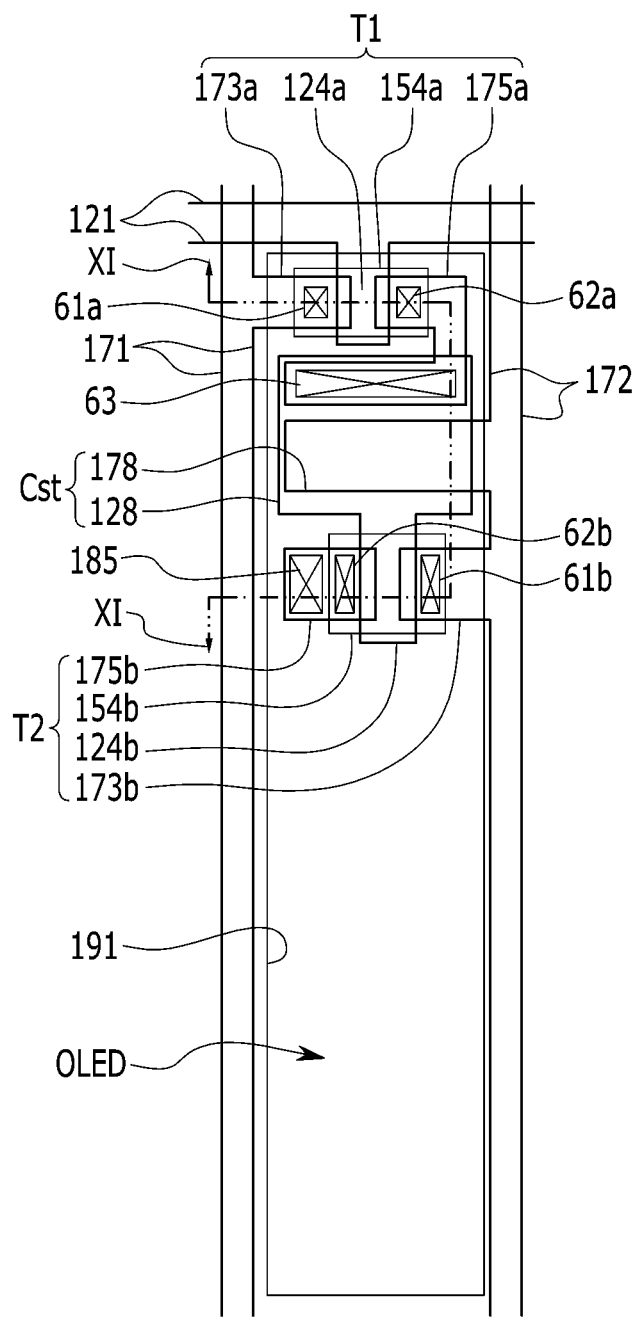
FIG. 10 shows a layout view of an OLED display according to an exemplary embodiment.
Figure 11:
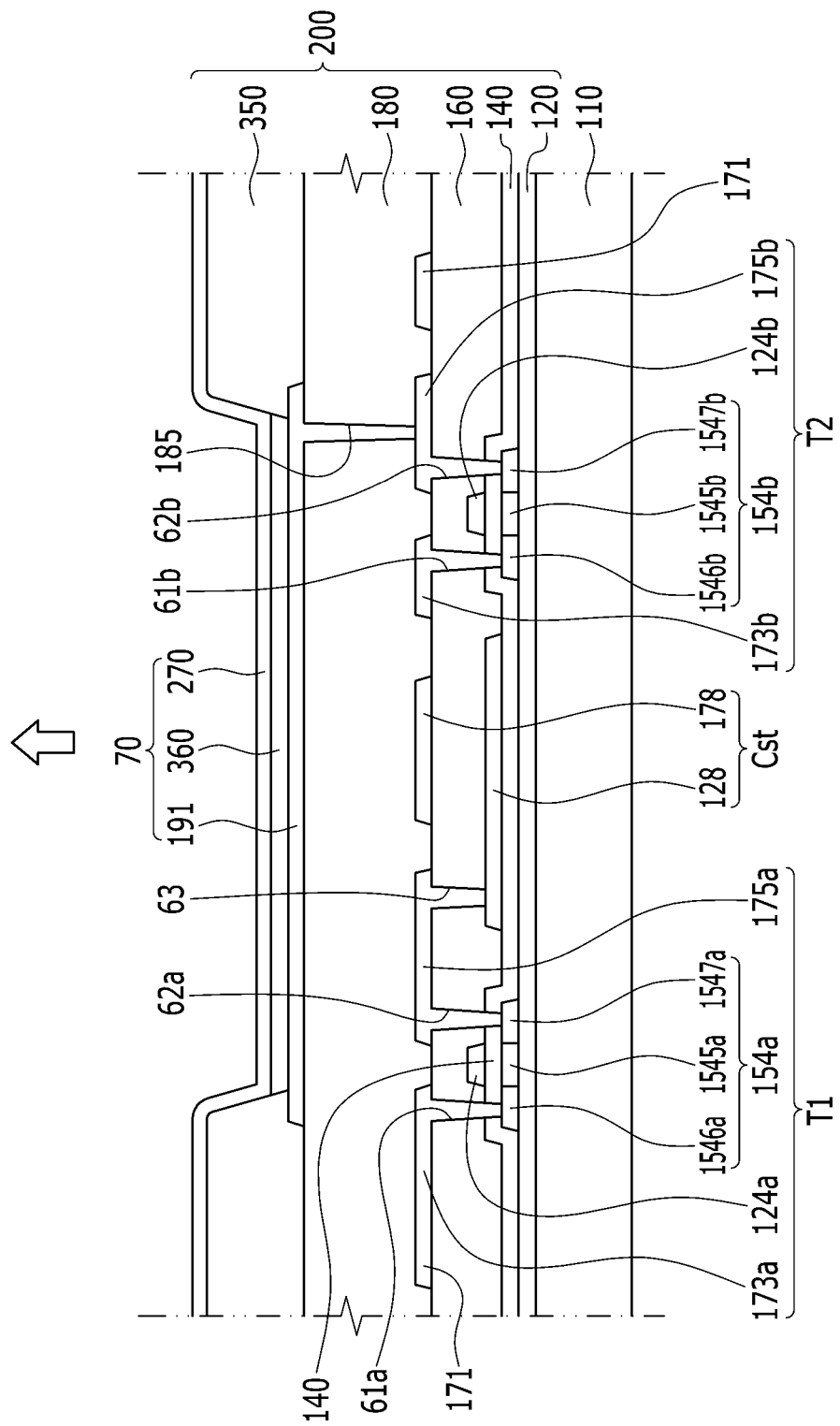
FIG. 11 shows a cross-sectional view with respect to line XI-XI of FIG. 10.

FIG. 10 shows a layout view of an OLED display according to an exemplary embodiment. FIG. 11 shows a cross-sectional view with respect to line XI-XI of FIG. 10.

Referring to FIG. 10 and FIG. 11, the OLED display includes a substrate 100, a thin film display layer 200 formed over the substrate 100, and an OLED 70.

The substrate 100 can be formed of transparent glass or plastic. Also, the substrate 100 may be flexible.

The thin film display layer 200 includes a buffer layer 120, switching and driving semiconductor layers 154a and 154b, a gate insulating layer 140, a gate line 121, a first storage capacitive plate 128, an interlayer insulating layer 160, a data line 171, a driving voltage line 172, a switching drain electrode 175a, a driving drain electrode 175b, and a passivation layer 180.

The buffer layer 120 is formed on the substrate 100 and it may be formed as a single layer of silicon nitride (SiNx) or a dual layer stacked with silicon nitride (SiNx) and silicon oxide (SiOx). The buffer layer 120 blocks unnecessary materials such as impurities or moisture from penetrating therethrough and flattens the surface of the substrate 100.

The switching semiconductor layer 154a and the driving semiconductor layer 154b are separately formed on the buffer layer 120. The switching semiconductor layer 154a and the driving semiconductor layer 154b are made of polysilicon and include channel regions (1545a, 1545b), source regions (1546a, 1546b), and drain regions (1547a, 1547b). The source regions (1546a, 1546b) and the drain regions (1547a, 1547b) are formed on respective sides of the channel regions (1545a, 1545b).

The channel regions (1545a, 1545b) are polysilicon with no doped impurities, that is, they are intrinsic semiconductors. The source regions (1546a, 1546b) and the drain regions (1547a, 1547b) are polysilicon including doped conductive impurities, that is, they are doped semiconductors.

A gate insulating layer 140 is formed on the channel regions (1545a, 1545b) of the switching and driving semiconductor layers 154a and 154b.

The gate insulating layer 140 may be a single layer or multiple layers including at least one of silicon nitride and silicon oxide.

A gate line 121 is formed on the gate insulating layer 140 and a first storage capacitive plate 128 is formed on the gate insulating layer 140.

The gate line 121 extends in a horizontal direction and transmits a gate signal and it includes a switching gate electrode 124a overlapping the switching semiconductor layer 154a from the gate line 121. The first storage capacitive plate 128 includes a driving gate electrode 124b overlapping the driving semiconductor layer 154b from the first storage capacitive plate 128. The switching gate electrode 124a and the driving gate electrode 124b respectively overlap the channel regions (1545a, 1545b).

An interlayer insulating layer 160 is formed on the gate line 121, the first storage capacitive plate 128, and the buffer layer 120.

A switching source contact hole 61a and a switching drain contact hole 62a for exposing the source and drain regions 1546a and 1547a of the switching semiconductor layer 154a are respectively formed in the interlayer insulating layer 160 and the gate insulting layer 140. Further, a driving source contact hole 61b and a driving drain contact hole 62b for exposing the source and drain regions 1546b and 1547b of the driving semiconductor layer 154b are respectively formed in the interlayer insulating layer 160 and the gate insulating layer 140.

A data line 171, a driving voltage line 172, a switching drain electrode 175a, and a driving drain electrode 175b are formed on the interlayer insulating layer 160.

The data line 171 transmits a data signal, extends in a direction that crosses the gate line 121, and includes a switching source electrode 173a protruded toward the switching semiconductor layer 154a from the data line 171.

The driving voltage line 172 transmits a driving voltage, is separated from the data line 171, and extends in substantially the same direction as the data line 171. The driving voltage line 172 includes a driving source electrode 173b protruded toward the driving semiconductor layer 154b from the driving voltage line 172, and a second storage capacitive plate 178 protruded from the driving voltage line 172 and overlapping the first storage capacitive plate 128. The first storage capacitive plate 128 and the second storage capacitive plate 178 form a storage capacitor (Cst) with the interlayer insulating layer 160 as a dielectric material.

The switching drain electrode 175a faces the switching source electrode 173a and the driving drain electrode 175b faces the driving source electrode 173b.

The switching source electrode 173a and the switching drain electrode 175a are respectively connected to the source region 1546a and the drain region 1547a of the switching semiconductor layer 154a through the switching source contact hole 61a and the switching drain contact hole 62a. Further, the switching drain electrode 175a extends toward and is electrically connected to the first storage capacitive plate 128 and the driving gate electrode 124b through a first contact hole 63 formed in the interlayer insulating layer 160.

The driving source electrode 173b and the driving drain electrode 175b are respectively connected to the source region 1546b and the drain region 1547b of the driving semiconductor layer 154b through a driving source contact hole 61b and a driving drain contact hole 62b.

The switching semiconductor layer 154a, the switching gate electrode 124a, the switching source electrode 173a, and the switching drain electrode 175a form the switching thin film transistor (T1). Similarly, the driving semiconductor layer 154b, the driving gate electrode 124b, the driving source electrode 173b, and the driving drain electrode 175b form the driving thin film transistor (T2).

A passivation layer 180 is formed on the data line 171, the driving voltage line 172, the switching drain electrode 175a, and the driving drain electrode 175b.

A second contact hole 185 for exposing the driving drain electrode 175b is formed in the passivation layer 180.

An OLED 70 and a pixel defining layer 350 are formed on the passivation layer 180.

The OLED 70 includes a pixel electrode 191, an organic emission layer 360, and a common electrode 270.

The pixel electrode 191 is formed on the passivation layer 180 and is electrically connected to the driving drain electrode 175b of the driving thin film transistor (T2) through the second contact hole 185 formed in the interlayer insulating layer 160. The pixel electrode 191 is an anode electrode of the OLED 70.

The pixel electrode 191 may be formed of a transparent conductive material such as indium tin oxide (ITO), indium zinc oxide (IZO), zinc oxide (ZnO), or indium oxide ($In_2O_3$), or a reflective metal such as lithium (Li), aluminum (Al), silver (Ag), magnesium (Mg), or gold (Au).

The pixel defining layer 350 is formed on an edge of the pixel electrode 191 and on the passivation layer 180.

The pixel defining layer 350 includes an opening for exposing the pixel electrode 191. The pixel defining layer 350 may be formed of a resin such as a polyacrylate or a polyimide.

An organic emission layer 360 is formed on the pixel electrode 191 in the opening of the pixel defining layer 350. The organic emission layer 360 is formed of multiple layers which include at least one of an emission layer, a hole-injection layer (HIL), a hole-transporting layer (HTL), an electron-transporting layer (ETL), and an electron-injection layer (EIL). When the organic emission layer 360 includes all of them, the hole-injection layer is formed on the pixel electrode 191 which is an anode electrode, and the hole-transporting layer, the emission layer, the electron-transporting layer, and the electron-injection layer are sequentially stacked thereon.

The organic emission layer 360 may include a red organic emission layer which emits red light, a green organic emission layer which emits green light, or a blue organic emission layer which emits blue light. The red, green, and blue organic emission layers are respectively formed on red, green, and blue pixels to implement a color image.

In other embodiments, the red, green, and blue organic emission layers are laminated in each of the red, green, and blue pixels and red, green, or blue color filters are formed for every pixel to implement a color image. In yet other embodiments, a white organic emission layer which emits white light is formed in each of the red, green, and blue pixels and red, green, or blue color filters are formed for every pixel to implement a color image. When the color image is implemented using the white organic emission layer and the color filters, a deposition mask which deposits the red, green, and blue organic emission layers on individual pixels, that is, in each of the red, green, and blue pixels, is not required.

The white organic emission described above, may be formed as one organic emission layer or include a configuration in which a plurality of organic emission layers are laminated to emit white light. For example, a configuration in which at least one yellow organic emission layer and at least one blue organic emission layer are combined to emit white light, a configuration in which at least one cyan organic emission layer and at least one red organic emission layer are combined to emit white light, or a configuration in which at least one magenta organic emission layer and at least one green organic emission layer are combined to emit white light may also be included.

The common electrode 270 is formed on the pixel defining layer 350 and the organic emission layer 360. The common electrode 270 may be formed of a transparent conductive material such as ITO, IZO, ZnO, or $In_2O_3$, or a reflective metal such as lithium, calcium, fluoride lithium/calcium, fluoride lithium/aluminum, aluminum, silver, magnesium, or gold. The common electrode 270 is a cathode electrode of the OLED 70.

The touch panel according to at least one embodiment can be attached to various kinds of display devices. That is, the display device may be a liquid crystal display or a plasma display device as well as the above-described organic electroluminescent display device.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a panel including a plurality of wiring patterns; and
a flexible printed circuit board formed over and at least partially overlapping an edge of the panel, wherein the flexible printed circuit board includes a connection portion electrically connected to the panel, wherein the connection portion includes first and second surfaces formed on opposite sides of the connection portion with respect to each other, and wherein the first surface of the connection portion is interposed between the center of the panel and the second surface of the connection portion,
wherein the wiring patterns include i) a plurality of first wiring patterns connected to the first surface of the connection portion and ii) a plurality of second wiring patterns connected to the second surface of the connection portion,
wherein the first and second wiring patterns extend away from the connection portion in different directions,
wherein the first surface of the connection portion faces the center of the panel and wherein the second surface of the connection portion faces the edge of the panel,
wherein the panel includes a touch panel and an encapsulation substrate encapsulating the touch panel, wherein the wiring patterns are formed i) over the encapsulation substrate and ii) in a peripheral area of the encapsulation substrate,
wherein the display device further comprises a window substrate covering the encapsulation substrate, and
wherein a recess is defined in an edge of the encapsulation substrate neighboring the connection portion.

2. A display device, comprising:
a panel including a plurality of wiring patterns; and
a flexible printed circuit board formed over and at least partially overlapping an edge of the panel, wherein the flexible printed circuit board includes a connection portion electrically connected to the panel and wherein the connection portion includes first and second surfaces formed on opposite sides of the connection portion with respect to each other,
wherein the wiring patterns include i) a plurality of first wiring patterns connected to the first surface of the connection portion and ii) a plurality of second wiring patterns connected to the second surface of the connection portion,
wherein the first surface of the connection portion faces the center of the panel,
wherein the second surface of the connection portion faces the edge of the panel,
wherein the panel includes a touch panel and an encapsulation substrate encapsulating the touch panel,
wherein the wiring patterns are formed i) over the encapsulation substrate and ii) in a peripheral area of the encapsulation substrate,
wherein the display device further comprises a window substrate covering the encapsulation substrate, and
wherein the window substrate is connected to the flexible printed circuit board via a double-sided adhesive tape.

3. The display device of claim 2, further comprising an adhesive layer interposed between the encapsulation substrate and the window substrate, wherein the adhesive layer overlaps substantially the entire encapsulation substrate and does not overlap the connection portion.

4. The display device of claim 3, wherein the encapsulation substrate is formed at least in part of a flexible material.

5. The display device of claim 2, wherein the double-sided adhesive tape is interposed between the connection portion and an edge of the encapsulation substrate adjacent to the connection portion.

6. The display device of claim 5, wherein the panel comprises upper and lower sides opposing each other and wherein the flexible printed circuit board is configured to be bent such that at least a portion of the flexible printed circuit board is below the lower side of the panel.

7. The display device of claim 1, further comprising an adhesive layer interposed between the encapsulation substrate and the window substrate, wherein the adhesive layer overlaps substantially the entire encapsulation substrate and does not overlap the connection portion.

8. The display device of claim 7, wherein the adhesive layer surrounds three sides of the connection portion.

9. The display device of claim 8, wherein the connection portion is spaced apart from the edge of the encapsulation substrate by the width of the recess.

10. The display device of claim 9, wherein the flexible printed circuit board substantially overlaps the recess.

11. The display device of claim 10, wherein the panel comprises upper and lower sides opposing each other and wherein at least a portion the flexible printed circuit board is configured to be bent toward the lower side of the panel.

12. The display device of claim 1, wherein the encapsulation substrate is formed at least partially of a flexible material.

13. A display device, comprising: a substrate; a plurality of pixels formed over the substrate; an encapsulation substrate formed over the pixels; a plurality of first and second wiring patterns formed over the encapsulation layer; and a flexible printed circuit board formed over and partially overlapping the encapsulation substrate, wherein the flexible printed circuit board comprises a connection portion electrically connected to the wiring patterns, wherein the connection portion includes first and second surfaces formed on opposite sides of the connection portion with respect to each other, and wherein the first surface of the connection portion is interposed between the center of the encapsulation substrate and the second surface of the connection portion; and a window substrate formed over the encapsulating substrate and connected to the flexible printed circuit board via a double-sided adhesive tape, wherein the first wiring patterns are connected to the first surface of the connection portion, wherein the second wiring patterns are connected to the second surface of the connection portion, wherein the first and second wiring patterns extend away from the connection portion in different directions, and wherein the double-sided adhesive tape is interposed between the connection portion and an edge of the encapsulation substrate adjacent to the connection portion.

14. The display device of claim 13, further comprising:
a contact sensing layer formed over the encapsulation substrate in a touch active area; and
a peripheral area surrounding the touch active area,
wherein the wiring patterns are formed in the peripheral area and are electrically connect to the contact sensing layer.

15. The display device of claim 13, further comprising an adhesive layer interposed between the encapsulation substrate and the window substrate, wherein the adhesive overlaps substantially the entire encapsulation substrate and does not overlap the connection portion or the double-sided adhesive tape.

16. The display device of claim 14, wherein a recess is defined in an edge of encapsulation substrate neighboring the connection portion and wherein the flexible printed circuit board substantially overlaps the recess.

17. The display device of claim 16, wherein the flexible printed circuit board comprises first and second portions, wherein the first portion is closer to the center of the encapsulation substrate than the second portion, and wherein the width of the first portion is greater than the width of the second portion.

* * * * *